(12) United States Patent
Fan

(10) Patent No.: US 8,720,700 B2
(45) Date of Patent: May 13, 2014

(54) SERVER RACK

(75) Inventor: Chen-Lu Fan, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 512 days.

(21) Appl. No.: 13/036,097

(22) Filed: Feb. 28, 2011

(65) Prior Publication Data

US 2012/0012544 A1    Jan. 19, 2012

(30) Foreign Application Priority Data

Jul. 19, 2010    (CN) .......................... 2010 1 0230152

(51) Int. Cl.
*A47F 7/00* (2006.01)

(52) U.S. Cl.
USPC .................... 211/26; 312/265.4; 211/191

(58) Field of Classification Search
USPC ........... 211/26, 175, 183, 189, 190, 191, 192, 211/204, 206; 312/265.1–265.4
See application file for complete search history.

(56) References Cited

U.S. PATENT DOCUMENTS

| | | | | |
|---|---|---|---|---|
| 4,101,233 A * | 7/1978 | McConnell | .................... | 403/397 |
| 4,556,148 A * | 12/1985 | Koller | ............................ | 211/189 |
| 5,749,476 A * | 5/1998 | Besserer et al. | ................. | 211/26 |
| 5,749,482 A * | 5/1998 | Clark | ............................. | 211/191 |
| 5,930,972 A * | 8/1999 | Benner et al. | ................. | 52/653.1 |
| 6,120,206 A * | 9/2000 | Benner et al. | ................. | 403/231 |
| 6,123,400 A * | 9/2000 | Nicolai et al. | .............. | 312/265.1 |
| 6,206,494 B1 * | 3/2001 | Benner et al. | .............. | 312/265.4 |
| 6,231,142 B1 * | 5/2001 | Pochet | ........................ | 312/265.3 |
| 6,428,127 B1 * | 8/2002 | Rasmussen | ................ | 312/265.4 |
| 6,974,036 B2 * | 12/2005 | Wyatt et al. | ....................... | 211/26 |
| 7,334,377 B2 * | 2/2008 | Dubensky et al. | .............. | 52/780 |
| 7,896,177 B1 * | 3/2011 | Toma | ............................. | 211/182 |
| 8,225,945 B2 * | 7/2012 | Fan | ................................ | 211/26 |
| 8,292,093 B2 * | 10/2012 | Fan | ................................ | 211/26 |
| 8,292,380 B2 * | 10/2012 | Fan | ............................ | 312/265.4 |
| 2011/0309046 A1 * | 12/2011 | Lee | ................................ | 211/182 |
| 2012/0012543 A1 * | 1/2012 | Fan | ................................ | 211/26 |
| 2012/0013236 A1 * | 1/2012 | Fan | ............................. | 312/351.1 |
| 2012/0024811 A1 * | 2/2012 | Fan | ............................... | 211/183 |
| 2012/0229007 A1 * | 9/2012 | Fan et al. | .................... | 312/223.1 |

* cited by examiner

*Primary Examiner* — Jerry Redman
(74) *Attorney, Agent, or Firm* — Novak Druce Connolly Bove + Quigg LLP

(57) ABSTRACT

A server rack includes an upper frame, a lower frame, and a support leg. The support leg connects the upper frame to the lower frame. An area is defined in the support leg. Each support leg includes a first outer wall, a second outer wall substantially perpendicular to the first outer wall, a first connecting wall extending perpendicularly from the first outer wall, a second connecting wall extending perpendicularly from the second outer wall. The first connecting wall is connected to the second connecting wall. A first recessed reinforcing portion is located in the first outer wall, and a second recessed reinforcing portion is located in the second outer wall.

16 Claims, 4 Drawing Sheets

SERVER RACK

BACKGROUND

This application is related to co-pending U.S. patent application entitled "RACK FRAME", U.S. application Ser. No. 12/955,930, filed on Nov. 30, 2010.

TECHNICAL FIELD

The present disclosure relates to electronic device enclosures, and more particularly to a server rack.

DESCRIPTION OF RELATED ART

Server system racks house electronic equipment, which may include among other things, network server systems, data storage devices, and power supplies units. A server rack generally includes two frames of the same configuration and four support legs connected to the two frames. The support legs often bend or twist under the weight of too many things being installed on the server rack.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
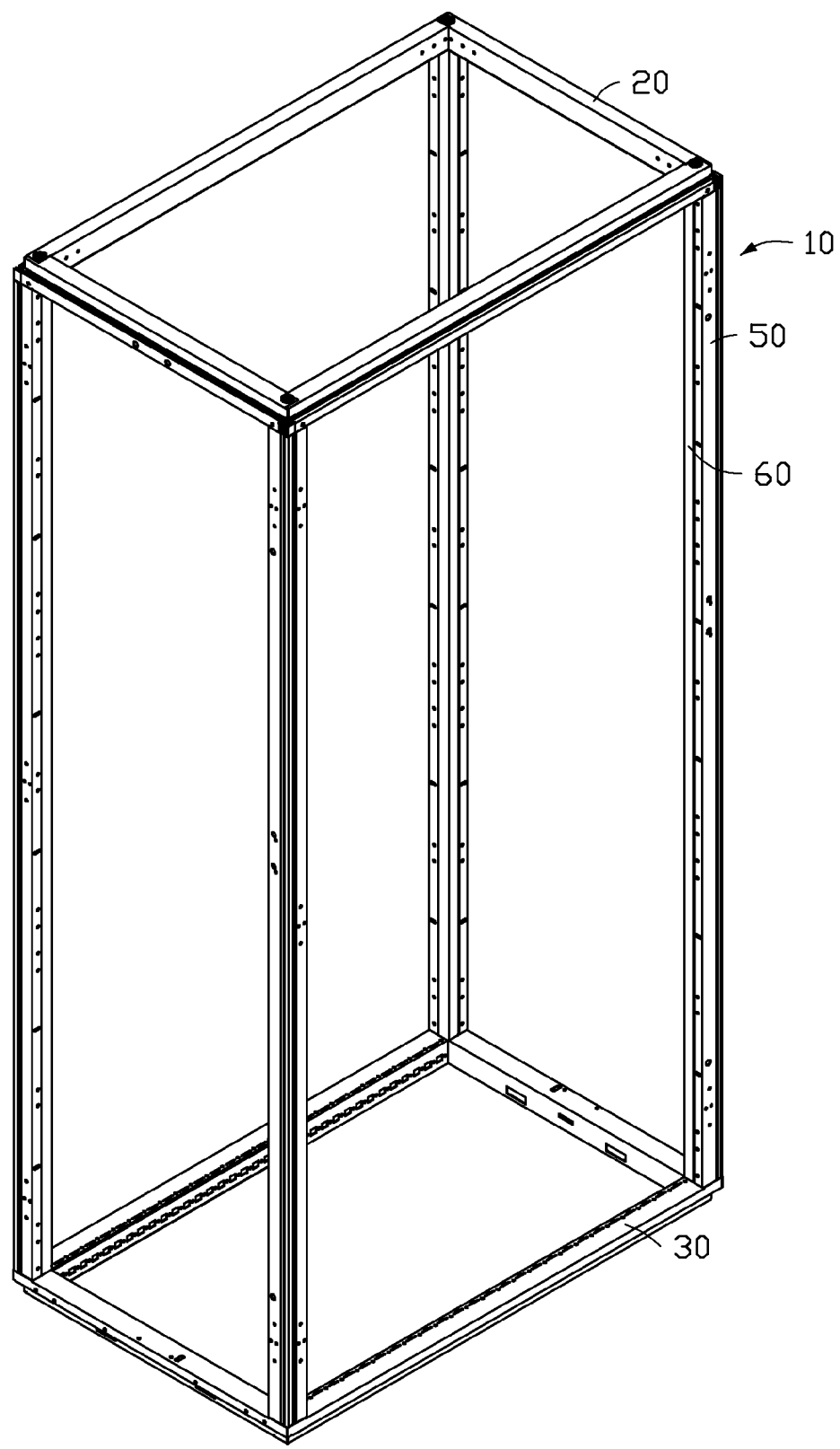
FIG. 1 is an isometric view of a server rack in accordance with an embodiment.

Referring to FIG. 1, a server rack 10 in accordance with an embodiment includes an upper frame 20, a lower frame 30 substantially parallel to the upper frame 20, and four support legs 50 located between the upper frame 20 and the lower frame 30. A mounting leg 60 is attached to each support leg 50. The four support legs 50 are parallel to each other and substantially perpendicular to the upper frame 20 and the lower frame 30.

Figure 2:
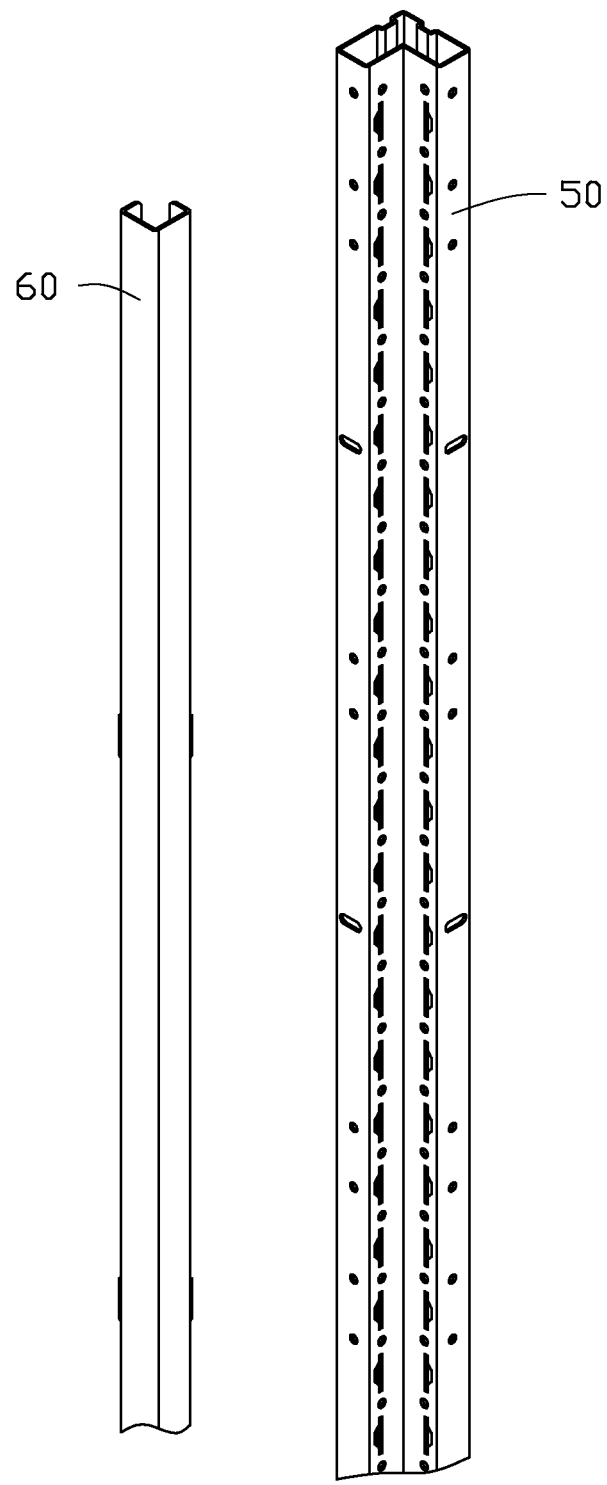
FIG. 2 is a partially exploded, isometric view of a server rack in accordance with an embodiment.
Figure 3:
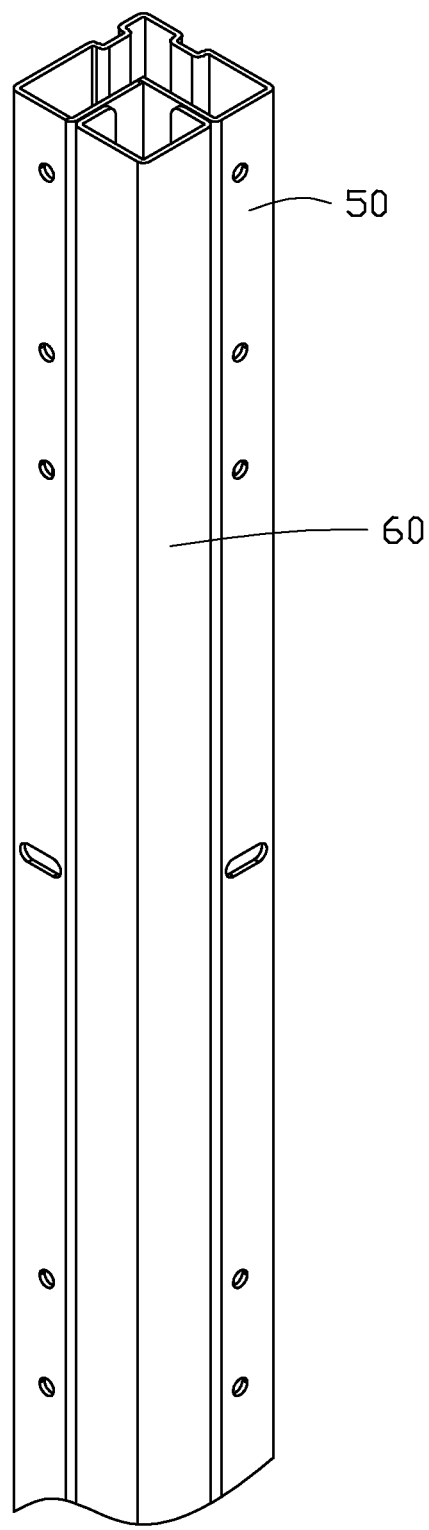
FIG. 3 is an assembled view of FIG. 2.
Figure 4:
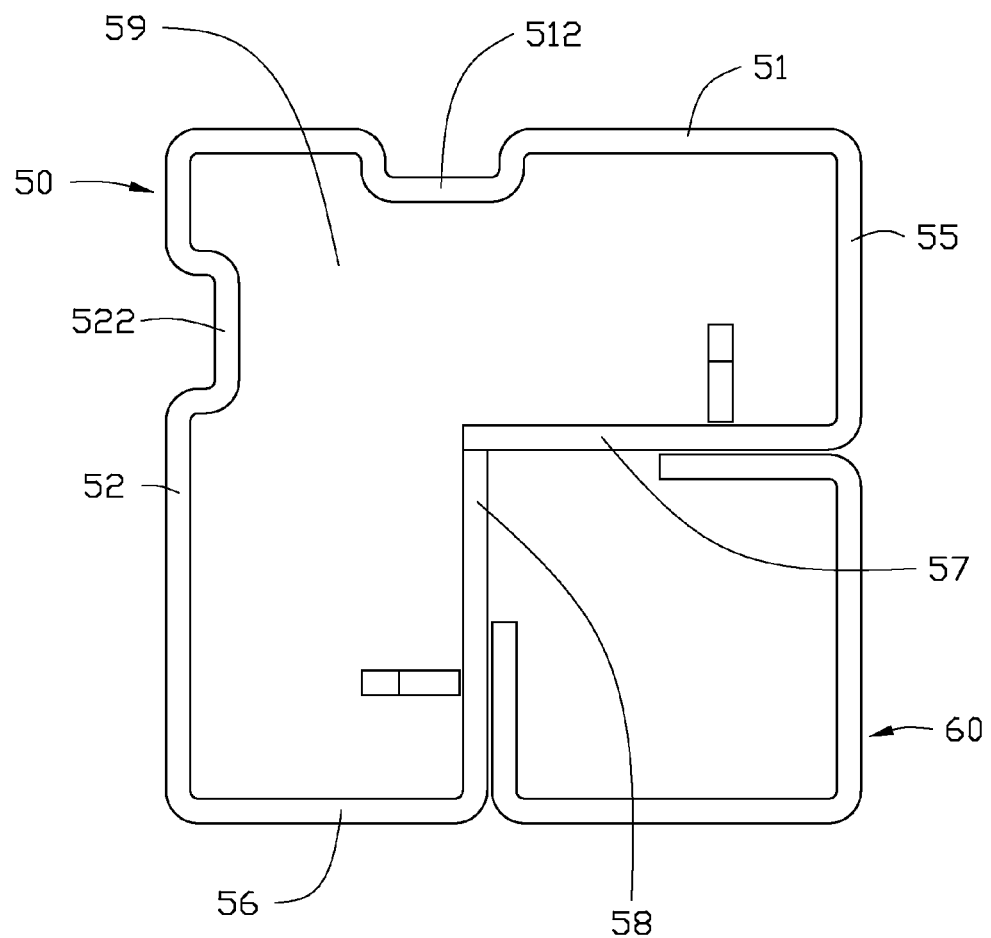
FIG. 4 is a vertical view of FIG. 3.

Referring to FIGS. 2-4, each support leg 50 includes a first outer wall 51, and a second outer wall 52, a first connecting wall 55, a second connecting wall 56, a first inner wall 57, and a second inner wall 58. The second outer wall 52 is substantially perpendicular to the first outer wall 51. The first connecting wall 55 extends perpendicularly from the first outer wall 51. The second connecting wall 56 extends perpendicularly from the second outer wall 52. The first inner wall 57 extends perpendicularly from the first connecting wall 55. The second inner wall 58 extends perpendicularly from the second connecting wall 56. The first inner wall 57 is substantially perpendicular to the second inner wall 58. An L-shaped area 59 is enclosed by each support leg 50. In one embodiment, the length of the cross section of the first connecting wall 55, taken along a plane parallel to the upper frame 20, is equal to the length of the cross section of the second connecting wall 56 taken along the same plane.

A first recessed reinforcing portion 512 is located in the first outer wall 51. A second recessed reinforcing portion 522 is located in the second outer wall 52. The first recessed reinforcing portion 512 and the second recessed reinforcing portion 522 are both U-shaped. The first recessed reinforcing portion 512 and the second recessed reinforcing portion 522 are located away from the first connecting wall 55 and the second connecting wall 56 respectively.

The mounting leg 60 is square shape with a cutout in cross-section. The mounting leg 60 is configured to mount a sliding track of a server.

Referring to FIGS. 1-4, the mounting legs 60 are mounted to the support legs 50. Each mounting leg 60 contacts the first inner wall 57 and the second inner wall 58 of each support leg 50. The mounting legs 60 and the support legs 50 are all rectangular in cross-section. The support legs 50 are connected between the upper frame 20 and the lower frame 30.

The support legs 50 are able to withstand forces applied in a direction parallel to the first outer wall 51 because of the first recessed reinforcing portion 512 and the second recessed reinforcing portion 522. The support legs 50 are also able to withstand forces applied in a direction perpendicular to the first outer wall 51 and the second outer wall 52 because of the L-shaped area 59, thus avoiding a tendency to bend or twist under a load.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A server rack comprising:
   an upper frame;
   a lower frame; and
   four support legs connecting the upper frame and the lower frame, an area defined in each support leg; each support leg comprising:
   a first outer wall;
   a second outer wall extending from the first outer wall and substantially perpendicular to the first outer wall;
   a first connecting wall extending perpendicularly from the first outer wall;
   a second connecting wall extending perpendicularly from the second outer wall;
   a first recessed reinforcing portion located in the first outer wall and recessed in the area; and
   a second recessed reinforcing portion located in the second outer wall.

2. The server rack of claim 1, wherein a cross section of the first recessed reinforcing portion is U-shaped.

3. The server rack of claim 1, wherein a cross section of the second recessed reinforcing portion is U-shaped.

4. The server rack of claim 1, wherein the area is L-shaped.

5. The server rack of claim 1, wherein a length of a cross section of the first connecting wall is substantially equal to a length of a cross section of the second connecting wall.

6. The server rack of claim 5, wherein a length of a cross section of the first outer wall is substantially equal to a length of a cross section of the second outer wall.

7. The server rack of claim 1, further comprising a mounting leg, wherein each support leg further comprises a first inner wall extending perpendicularly from the first connecting wall and a second inner wall extending perpendicularly from the second connecting wall, the first inner wall is connected to the second inner wall and is substantially perpendicular to the second inner wall; the mounting leg is attached to the first inner wall and the second inner wall, and the support leg and the mounting leg have a rectangular cross-section.

8. The server rack of claim 7, wherein a cross section of the mounting leg is a square shape with a cutout.

9. A server rack comprising:
an upper frame;
a lower frame substantially parallel to the upper frame; and
four support legs connecting the upper frame and the lower frame, the four support legs are parallel to each other and substantially perpendicular to the upper frame, each support leg comprising:
a first outer wall;
a second outer wall extending from the first outer wall and substantially perpendicular to the first outer wall;
a first connecting wall extending perpendicularly from the first outer wall;
a second connecting wall extending perpendicular from the second outer wall,
a first inner wall extending perpendicularly from the first connecting wall;
a second inner wall extending perpendicularly from the second connecting wall, wherein the first inner wall is connected to the second inner wall, and a cross section of each support leg taken along a plane parallel to the upper frame is L-shaped.

10. The server rack of claim 9, wherein a first recessed reinforcing portion is located in the first outer wall, and a cross section of the first recessed reinforcing portion taken along the plane is U-shaped.

11. The server rack of claim 9, wherein a second recessed reinforcing portion is located in the second outer wall, and a cross section of the second recessed reinforcing portion is U-shaped.

12. The server rack of claim 9, wherein a length of a cross section of the first connecting wall is substantially equal to a length of a cross section of the second connecting wall taken along the plane.

13. The server rack of claim 12, wherein a length of a cross section of the first inner wall is substantially equal to a length of a cross section of the second inner wall taken along the plane.

14. The server rack of claim 9, further comprising a mounting leg attached to the first inner wall and the second inner wall, and the support leg and the mounting leg having a rectangular cross-section.

15. The server rack of claim 14, wherein a cross section of the mounting leg is a square shape with a cutout.

16. The server rack of claim 9, wherein the first inner wall is substantially perpendicular to the second inner wall.

* * * * *